United States Patent
Cheng et al.

(10) Patent No.: US 7,548,029 B2
(45) Date of Patent: Jun. 16, 2009

(54) BI-DIRECTIONAL CURRENT SENSING BY MONITORING VS VOLTAGE IN A HALF OR FULL BRIDGE CIRCUIT

(75) Inventors: Xiao-Chang Cheng, San Jose, CA (US); Jun Honda, El Segundo, CA (US); Dana Wilhelm, Temple City, CA (US)

(73) Assignee: International Rectifier Corporation, El Segundo, CA (US)

( * ) Notice: Subject to any disclaimer, the term of this patent is extended or adjusted under 35 U.S.C. 154(b) by 619 days.

(21) Appl. No.: 11/144,205

(22) Filed: Jun. 2, 2005

(65) Prior Publication Data

US 2005/0270012 A1 Dec. 8, 2005

Related U.S. Application Data

(60) Provisional application No. 60/576,829, filed on Jun. 2, 2004.

(51) Int. Cl.
*G05F 1/00* (2006.01)
(52) U.S. Cl. ............................. 315/291; 315/224; 363/98
(58) Field of Classification Search ................. 315/291, 315/209 R, 307, 224, 360, 362; 361/90, 361/91.1, 16, 17, 132, 97, 21.01, 21.03
See application file for complete search history.

(56) References Cited

U.S. PATENT DOCUMENTS

| | | | | |
|---|---|---|---|---|
| 5,436,581 A | * | 7/1995 | Oberhauser | ................... 327/50 |
| 6,124,680 A | * | 9/2000 | Shoji et al. | ................... 315/291 |
| 6,222,327 B1 | * | 4/2001 | Shoji et al. | ................... 315/291 |
| 6,813,173 B2 | * | 11/2004 | Lipcsei | ........................ 363/98 |
| 7,049,767 B2 | * | 5/2006 | Wilhelm | ...................... 315/291 |

* cited by examiner

*Primary Examiner*—Douglas W Owens
*Assistant Examiner*—Jimmy T Vu
(74) *Attorney, Agent, or Firm*—Ostrolenk, Faber, Gerb & Soffen, LLP

(57) ABSTRACT

An apparatus and method for determining the output current in a bridge-connected switched transistor output circuit including high-side and low-side transistor switches, typically MOSFETS. The voltage at a common node between the high and low side switches is sensed, and offset in a first circuit by a fixed amount so that the voltage is positive for all positive or negative output currents of interest. The output current is actually determined in a second circuit which receives the offset voltage signal only predetermined times in relation to the on-time of the low side switch. The first circuit includes a current reference source/level shifter and a current mirror circuit formed of a plurality of transistors in a particular circuit configuration. The second circuit is coupled to an output of the first circuit by a gated NMOS transistor at the desired times to provide the current measurement signal. The second circuit includes a second current reference source having substantially the same electrical characteristics as the first current reference source, and a second plurality of transistors respectively matched to the input side circuit transistors, and connected in the same circuit configuration. In the second circuit, the offset signal is compared with high and low reference signals to provide an indication if the output current exceeds an overcurrent limit, either positively or negatively. The sensing circuit is advantageously integrated with the output circuit gate driver in a single IC.

20 Claims, 4 Drawing Sheets

BI-DIRECTIONAL CURRENT SENSING BY MONITORING VS VOLTAGE IN A HALF OR FULL BRIDGE CIRCUIT

CROSS-REFERENCE TO RELATED APPLICATIONS

This application is based on and claims priority to U.S. Provisional Application 60/576,829, filed Jun. 2, 2004, the entire disclosure of which is incorporated herein by reference.

This application is also related to U.S. patent application Ser. No. 10/806,688, filed Mar. 23, 2004, in the name of Dana Wilhelm, entitled HIGH VOLTAGE OFFSET DETECTION CIRCUIT AND METHOD, the entire disclosure of which is also incorporated herein by reference.

BACKGROUND OF THE INVENTION

1. Technical Field of the Invention

The present invention relates to a method and apparatus for bidirectional current sensing for high power full and half-bridge transistor circuits, and more particularly, to such a method and apparatus which no insertion of elements into the power circuit, and which can be fully integrated into the bridge driver IC.

The invention will be described in the context of a half-bridge MOSFET circuit, but should be understood that the concepts disclosed are also directly applicable to circuits employing other types or power transistors, ane to circuits in full-bridge topology.

2. Related Art

High voltage half-bridge and full-bridge power circuits are used in various applications such as motor drives, electronic ballasts for fluorescent lamps and power supplies. A simple half-bridge circuit is illustrated at 10 in FIG. 1. The circuit employs high-side and low-side totem pole connected MOSFETS $M_{HS}$ and $M_{LS}$ that feed a load 12 connected to a common point 14 between the MOSFETS, and a second common point 16 between two capacitors C1 and C2, through a first circuit path including MOSFET $M_{HS}$ and capacitor C1, and a second circuit path including MOSFET $M_{LS}$ and capacitor C2.

A gate drive circuit 18, typically an IC, supplies gate drive signals to turn MOSFETS $M_{HS}$ and $M_{LS}$ on or off in response logic input signals $H_{IN}$ and $L_{IN}$.

In power applications involving a half bridge or full bridge topology, current sensing is often needed for feedback or to prevent run away situations. Conventional methods of current sensing require insertion of external elements such as resistors into the power circuit, e.g. between MOSFET $M_{HS}$ and $M_{LS}$ (not illustrated), which are intrusive, i.e. cause power dissipation, and require extra pins on the driver IC.

Moreover, in some high power bridge topology applications, e.g., Class-D amplifiers, the power transistors are connected between plus and minus voltage rails, rather than a high voltage rail and ground as illustrated in FIG. 1. In such cases, both positive and negative currents may be encountered. The measuring circuitry in the driver IC must be able to accommodate the negative swings if is to be usable in all power bridge applications.

Thus, a need exists for a circuit implementation and method which avoids the need for insertion of a sensing element in the power circuit, can be integrated with the driver IC, and which is capable of measuring bidirectional currents. The present invention is intended to meet this need.

SUMMARY OF THE INVENTION

According to the present invention, the low side switch in the half/full bridge circuit doubles as the current sensing element. Since the $R_{DSON}$ of the MOSFET switching element is known, and the drain voltage of the switch is the same as the VS (common node) voltage, the current in the circuit can be ascertained by sensing the VS voltage while the low side switch is on. This method of current sensing is completely non-intrusive and can be fully integrated into the driver IC.

The VS sensing portion of the new circuit is based on a technique disclosed in the above-identified Dana Wilhelm patent application. The device of the Wilhelm application is intended to be used for offset detection, i.e., to determine when a common node has transitioned from a high state to a low state or from a low state to a high state. This might be needed, for example, in an electronic ballast driving a resonant load, in which case, premature turn on of the low-side MOSFET will pull the voltage at the common node to the voltage of the low side rail. This so-called "hard-switching" is a source of switching losses and causes heating of MOSFETS $M_{HS}$ and $M_{LS}$, which may eventually lead to failure of the MOSFETS.

Now, it has been recognized that the concepts of the Wilhelm device can also be adapted to current sensing. Moreover, by shifting the voltage at MOSFET node 14 the VS voltage up by a fixed amount before it is transferred to the low side of the sense circuit, sensing of a negative and negative current becomes possible, making the current sensing bi-directional.

Accordingly, it is an object of the present invention to provide an improved apparatus and method for sensing current in high power MOSFET switched output circuits.

It is a further object to provide such an apparatus and method in which the voltage at a common node between two switching transistors connected in a totem pole configuration is used to determine current on the basis of the $R_{DSON}$ of the low side transistor.

It is an additional object to provide such an apparatus and method in which the voltage at the common node is shifted up by a predetermined amount to permit sensing of negative currents.

Another object of the invention is to provide a current sensing arrangement which does not require insertion of a sensing element in the output current path.

It is also an object of the invention to provide a current sensing arrangement which can be combined with the other components of the driver for the switching transistors in a single integrated circuit.

It is yet another object of the invention to provide a current sensing arrangement as described above which can be used with devices having both half-bridge and full-bridge topology.

According to one aspect of the invention, there is provided an arrangement for sensing current in a high power MOSFET switched output circuit including two switching transistors connected in a totem pole configuration, in which the voltage at a common node between the transistors is sensed by circuitry connected to the common node, and the voltage is used to calculate current on the basis of the $R_{DSON}$ of the low side transistor.

According to another aspect of the invention, the above-described arrangement is integrated with the other components of the driver for the output transistors.

According to a further aspect of the invention, the voltage at the common node between the transistors is shifted up by a fixed amount so that both positive and negative currents through the $R_{DSON}$ of the low side transistor can be measured.

The exact nature of the invention, as well as other objects, features, and advantages thereof, will become apparent from the following from the following description of the invention which refers to the accompanying drawings, in which like parts are designated by the same reference number.

BRIEF DESCRIPTION OF THE DRAWING(S)

DETAILED DESCRIPTION OF THE INVENTION

Figure 1:
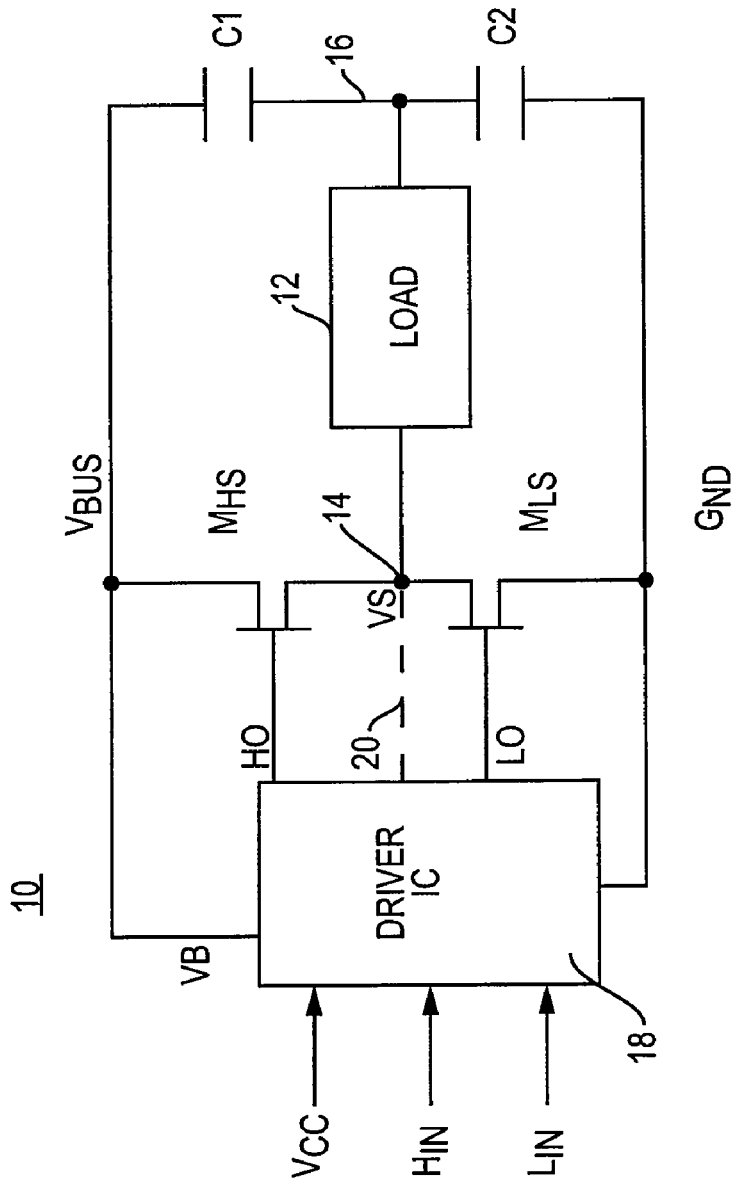
FIG. 1 is a diagram of a simplified half-bridge circuit to which the present invention is applicable.

Referring again to FIG. 1, application of the principles of this invention to the illustrated circuit arrangement requires inclusion of a sensing circuit within IC 18, and connection of common node 14 to the proper pin of the IC, as indicated by broken line 20.

Figure 3:
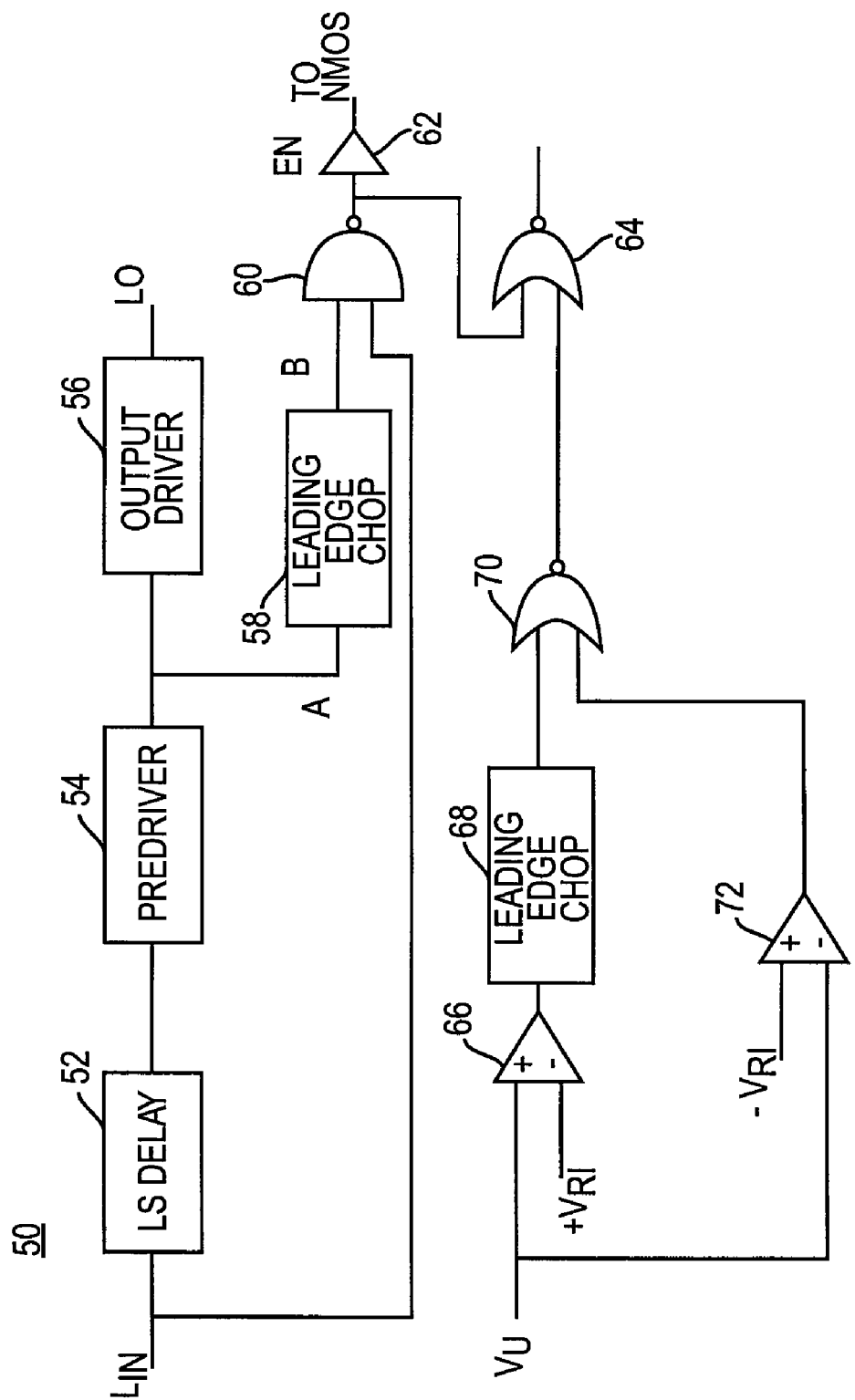
FIG. 3 is a block diagram showing the signal processing for a bidirectional overcurrent sensor.

Circuitry for implementing the arrangement according to the invention is illustrated in FIG. 3. The circuit, generally denoted at 30, is comprised of two portions: a current reference/mirror circuit including MOSFETS M2-M5 plus a level shifting resistor R1 in a high side well 32, and matched circuits (except for the level shift resistor) on the low side including MOSFETS M6-M9. The two sides are linked by high voltage NMOS M1, which is turned on to pass along the VS voltage when the high side well is near ground as described in connection with FIG. 3.

The operation of circuit 30 is as follows: VS is shifted up by a constant amount Iref1*M3/M2*R1 so that the shifted voltage V1=VS+Iref1*M3/M2*R1 is always positive. If the current reference and current mirrors on the high side are matched to their counterparts on the low side, i.e. Iref1=Iref2, M3/M2=M7/M6, and M5/M4=M9/M8, then V3=V1 and V4 differs from V3 by $V_{DSON}$ of NMOS M1, which is very small. It should be appreciated, however, that the foregoing relationships apply only whine V1 is positive V1. When V1 is negative, V3 does not follow V1. Instead V2 is lowered and M5 is pinched off, preventing the body diode of M1 from turning on and M1 from latching up destructively.

The end result is $$V4(Vsense) = VS + Iref1*M3/M2*R1 - V_{DSON},$$

$$M1 \sim VS + Iref1*M3/M2*R1.$$

Since VS is equal to the product of the $R_{DSON}$ of the low side switch and the low side switch current, the latter can easily be derived with the illustrated circuit.

FIG. 3 illustrates a practical use of the concepts described above. Here, the low side logic input $L_{IN}$ is connected through a low side delay circuit 52, a pre-driver circuit 54 and an output driver 56 (all three of any suitable or desired type) to provide the gate drive signal $L_O$ for the low-side MOSFET switch $M_{LS}$ (see FIG. 1). The low-side delay is employed to provide a suitable dead time between turn off of the high-side switch $M_{HS}$ and turn on of the low-side switch $M_{LS}$.

Figure 4:
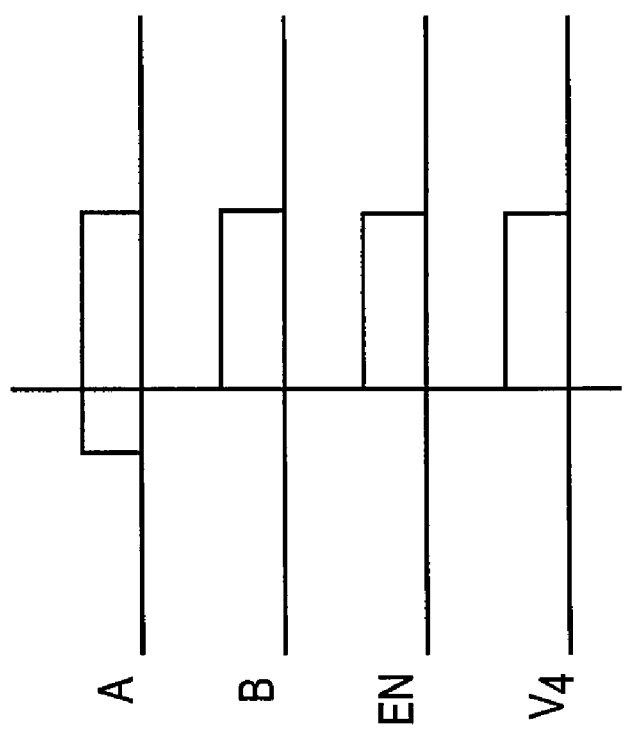
FIG. 4 is a waveform diagram for the circuit of FIG. 3.

To guard against external noise and prevent unwanted shoot through in M1, as indicated by the waveform of V4 shown in FIG. 4, it is preferred that current sensing be enabled only after the low side switch $M_{LS}$ has been on for some time. For this purpose, the output of pre-driver 54 is connected through a leading edge chop filter 58, a NAND gate 60, and an inverter 62 to provide a delayed version of the low side gate drive signal $L_O$ as an enable signal for NMOS M1 (see FIG. 2). A second input to NAND gate 60 is provided by the un-delayed version of the low side logic input signal $L_{IN}$.

The V4 sense signal is also used to provide an over current sensing function. For this purpose, the V4 signal is coupled respectively to the direct and inverting inputs of comparators 66 and 72. Second inputs for comparators 66 and 72 are provided by plus and minus reference signals $+V_{R1}$ and $-V_{R1}$ respectively, which represent the positive and negative over current thresholds. The output of inverter 60 is connected through a leading edge chop filter 68 as one input to a NOR gate 70, the second input of which is provided directly from inverter 72.

The output of gate 70 is fed as an input, along with the output of NAND gate 60 as an input to NOR gate 64.

The output of NOR gate 64 provides the over current indication signal.

Figure 5:
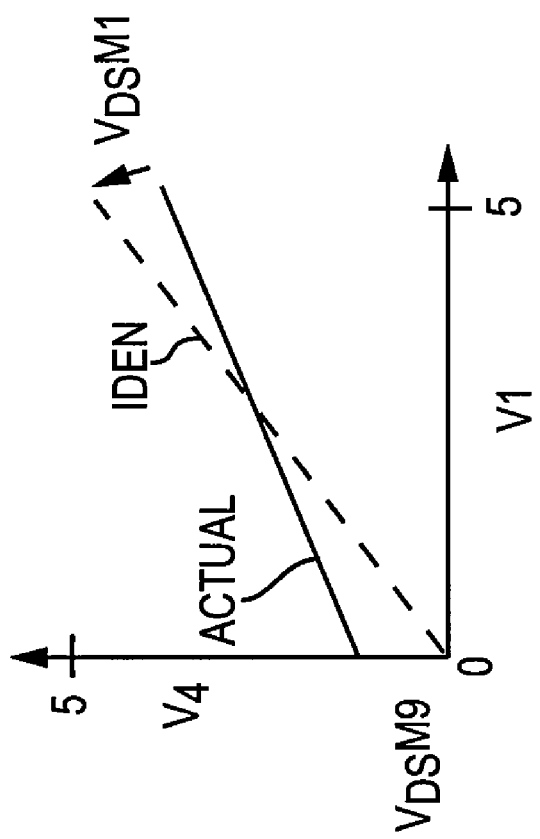
FIG. 5 shows the relationship between certain voltages in the circuit of FIG. 2.

For accurate current (VS) sensing, the current I1 in M1 needs to be small enough so that $V_{DSON}$ of M1 and M5 are negligible (see FIG. 5). This is balanced by the requirement that the current be large enough to limit the transients at V4. These transients are caused by capacitive coupling from the gate of M1, and can be seen as false peaks in V4 when M1 is turned on (FIG. 4). The transients can be suppressed by either using a low pass filter after V4 or by placing a leading edge chop filter after V4 has been compared to the over current threshold voltage. Larger I1 will charge up the parasitic capacitance at V4 more quickly, allowing faster filters to be used and improving response time.

Figure 2:
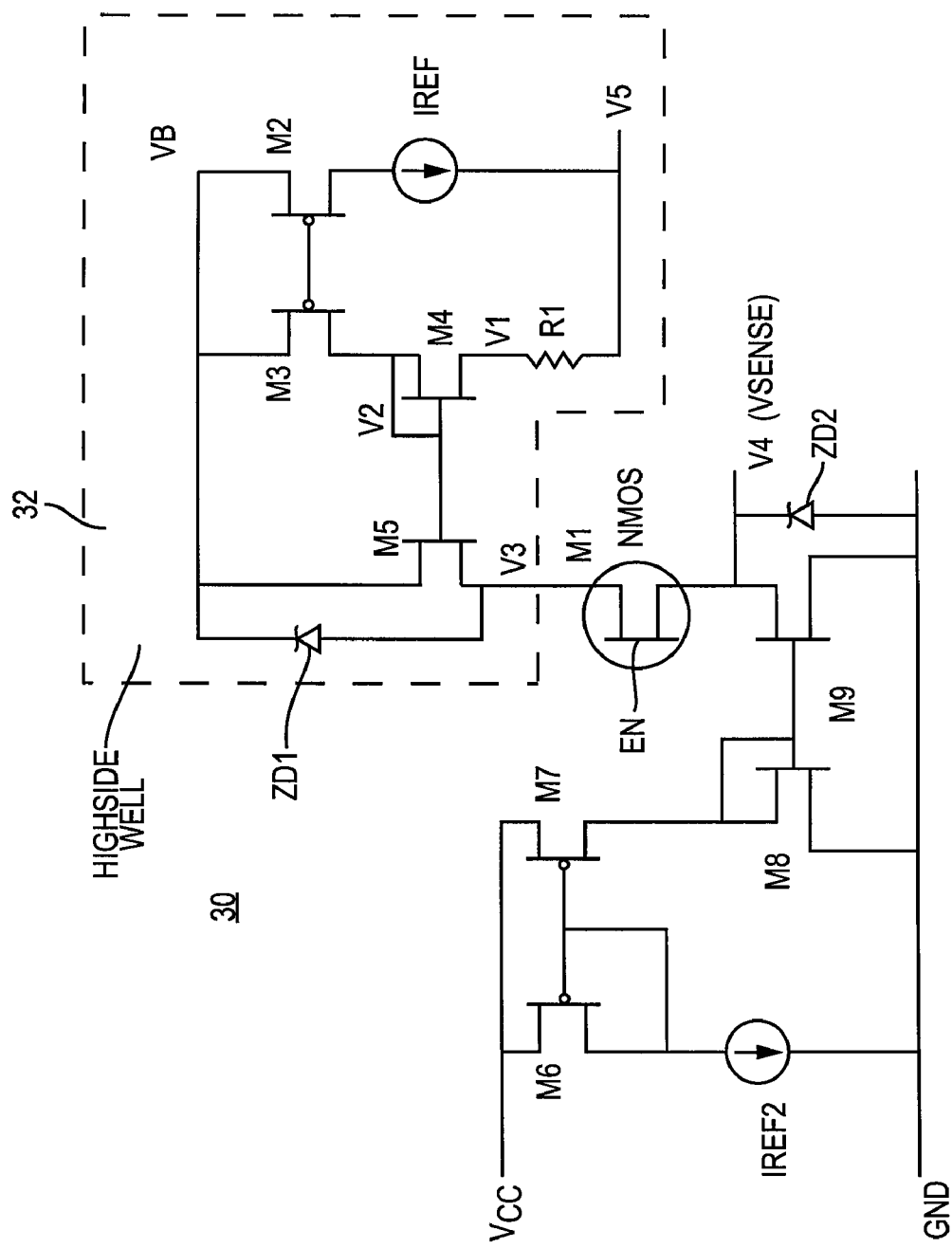
FIG. 2 is a schematic diagram of the new current sensing circuit according to the invention.

As will be appreciated, to sense large negative current, Iref1 and R1 must be chosen properly to ensure that VS+Iref1*M3/M2*R1 is always positive. Also, for reliable current sensing under all conditions, Iref1 and R1 should be selected to be substantially unaffected by variations in the power supply and temperature. Further, the robustness of the circuit is improved by using zener diodes ZD1 and ZD2 to limit high voltage transients at the source and drain of M1 (FIG. 2).

Although the present invention has been described in relation to particular embodiments thereof, many other variations and modifications and other uses will become apparent to those skilled in the art. It is intended, therefore, that the invention not be limited not by the specific disclosure herein, but that it be given the full scope permitted according to the appended claims.

What is claimed is:

1. A gate driver for a bridge-connected switched transistor output circuit including a high-side and a low-side transistor switch, the gate driver comprising:

a first input for receiving a high-side switch enable signal;

a second input for receiving a low-side switch enable signal;

a third input for connection to a common node between the high and low side switches;

a first output for providing a gate drive signal for the high-side switch;

a second output for providing a gate drive signal for the low-side switch;

a third output for providing a measurement signal representative of the output current through the high and low side switches;

an offset circuit electrically coupled to the third input which includes a reference current source, a level shifter, and a current mirror circuit formed of a plurality of transistors in a particular circuit configuration;

a measuring circuit electrically coupled to the offset circuit including a second current reference source having substantially the same electrical characteristics as the first current reference source, and a second plurality of transistors respectively matched to the input side circuit transistors, and connected in the same circuit configuration;

a coupling element which connects the offset circuit to the measuring circuit in response to a gating signal, wherein the offset circuit is operative to offset the voltage of a signal at the first input terminal in a predetermined manner and to pass the offset signal to the coupling circuit;

the coupling element is responsive to the gating signal to pass the offset signal to the measuring circuit; and the measuring circuit is operative to generate the measurement signal.

2. A gate driver according to claim 1, wherein the offset circuit, the coupling circuit and the measuring circuit are embodied in an integrated circuit.

3. A gate driver according to claim 1, wherein the output current is not affected by connection of the common node to the offset circuit.

4. A gate driver according to claim 1, wherein the transistors in the offset circuit and the measuring circuit are MOSFETs, and the coupling element is an NMOS high voltage transistor.

5. A gate driver according to claim 1, wherein the gating signal is generated from a delayed version of the signal at the first input.

6. A gate driver according to claim 5, wherein the gating signal is generated by passing the signal at the first input through a leading edge chop filter.

7. A gate driver according to claim 1, wherein the measuring circuit includes:

a comparator arrangement which compares the offset signal passed to the output side circuit by the coupling element with a reference representing an overcurrent limit; and a circuit which couples the comparator arrangement circuit to the third output.

8. A gate driver according to claim 7, further including a filter circuit connected between the comparator arrangement and the coupling circuit.

9. A gate driver circuit according to claim 8, wherein the filter circuit comprises a leading edge chop filter.

10. A gate driver circuit according to claim 7, wherein the comparator arrangement includes:

a first comparator circuit which compares the offset signal with a positive overcurrent limit signal;

a second comparator circuit which compares the offset signal with a negative overcurrent limit signal; and wherein:

the first comparator is coupled through a filter circuit to the output circuit; and the second comparator is coupled directly to the output circuit.

11. A gate driver according to claim 1, wherein the offset signal is generated by adding a fixed voltage to the voltage at the third input.

12. A method for determining the output current in a bridge-connected switched transistor output circuit including high-side and low-side transistor switches, the method comprising:

determining the voltage at a common node between the high and low side switches without use of any element which alters the output current as a consequence of the determination;

electrically coupling a signal representing the voltage at the common node through a first circuit which increases the signal in a positive sense to produce an offset voltage signal; and electrically coupling the offset voltage signal through a second circuit to obtain a measurement signal representing output current.

13. A method according to claim 12, wherein a fixed voltage is added to the signal representing the voltage at the common node to produce the offset signal.

14. A method according to claim 12, wherein the voltage of the signal at the common node is offset by a sufficient amount that the resulting offset signal is positive for bidirectional currents of all desired magnitudes.

15. A method according to claim 12, wherein the high and low side switches are turned on and off by separate gating signals and the offset signal is coupled to the second circuit only during a portion of an on-time for the low-side switch.

16. A method according to claim 15, further including the step of preventing the offset signal from being coupled to the second circuit if its value is negative.

17. A method according to claim 12, further including the step of comparing the offset signal with a reference signal and providing an output signal when the offset signal represents an overcurrent threshold for the output circuit.

18. A method according to claim 12, further including the step of comparing the offset circuit with positive and negative reference signals; and providing an indication when the offset signal represents a positive or negative overcurrent threshold for the output circuit.

19. A gate driver for a bridge-connected switched transistor output circuit including a high-side and a low-side transistor switch, the gate driver comprising:

a sensing device connected to a common node positioned between the high side and low side transistor switches and operable to determine a voltage at the common node without use of any element which alters the output current as a consequence of the determination;

a level shift circuit connected to the sensing device and operable to increase a signal representing the voltage at the common node provided from the sensing device in a positive sense to produce an offset voltage signal; and a measurement circuit connected to the level shift circuit and operable to provide a measurement signal representing output current based on the offset voltage signal.

20. The gate driver of claim 19, wherein the level shift circuit adds a fixed voltage to the signal representing the voltage at the common node to provide the offset voltage signal.

* * * * *